US009558797B2

(12) United States Patent
Curatolo et al.

(10) Patent No.: US 9,558,797 B2
(45) Date of Patent: Jan. 31, 2017

(54) METHOD AND APPARATUS FOR CONTROLLING CURRENT IN AN ARRAY CELL

(71) Applicant: Infineon Technologies AG, Neubiberg (DE)

(72) Inventors: Giacomo Curatolo, Unterhaching (DE); Wolf Allers, Munich (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/095,482

(22) Filed: Apr. 11, 2016

(65) Prior Publication Data

US 2016/0307608 A1 Oct. 20, 2016

(30) Foreign Application Priority Data

Apr. 14, 2015 (DE) ........................ 10 2015 004 824

(51) Int. Cl.

| | |
|---|---|
| ***G11C 7/22*** | (2006.01) |
| ***G11C 7/12*** | (2006.01) |
| ***G11C 5/14*** | (2006.01) |
| *G11C 7/20* | (2006.01) |

(52) U.S. Cl.

CPC . *G11C 7/12* (2013.01); *G11C 5/14* (2013.01); *G11C 7/20* (2013.01)

(58) Field of Classification Search

CPC ............. G11C 7/22; G11C 5/14; G11C 5/147; G11C 7/12; G11C 7/20

USPC .............. 365/203, 185.25, 189.11, 202, 204, 226,365/230.06

See application file for complete search history.

(56) References Cited

U.S. PATENT DOCUMENTS 4,604,728 A * 8/1986 Okajima ............... G11C 11/415 365/155

5,270,978 A * 12/1993 Matsumoto ............ G11C 16/28 365/185.11

6,212,120 B1 * 4/2001 Nakamura ........... G11C 7/1048 365/190

2010/0124101 A1 * 5/2010 Park ......................... G11C 7/08 365/163

2012/0250401 A1 10/2012 Storms et al.

* cited by examiner

*Primary Examiner* — Tan T. Nguyen

(74) *Attorney, Agent, or Firm* — Eschweiler & Associates, LLC

(57) ABSTRACT

A method and an apparatus for controlling current in an array cell is disclosed. The method includes applying a supply voltage to a first access point of a transistor, pre-charging a second access point of the transistor to a predetermined voltage, applying a control voltage to a third access point of the transistor, and discharging the second access point of the transistor to turn on the transistor which causes a current flow through the array cell connected to the transistor.

18 Claims, 4 Drawing Sheets bit line
source line
word line
array cell
1. current control device
2. current control device
1st access point 121
2nd access point 122
3rd access point 123
110
120
130
140
151a
151b
151c
152
153
154
155
156a
156b
157a
157b
158
159 bit line
1. current control device
130
153
158
first switch
270
array cell
140
152
156b
156a
154
1st access point 121
120
157a
3rd access point 123
157b
word line
2nd access point 122
2. current control device
240
155b
159
second switch
280
155a
source line bit line
451a
451b
1st access point 121
array cell
110
152
120
3rd access point 123
word line
157a
157b
156b
2nd access point 122
156a
current control device
440
159
155
source line

METHOD AND APPARATUS FOR CONTROLLING CURRENT IN AN ARRAY CELL

CROSS REFERENCE TO RELATED APPLICATION

This application claims priority to German Patent Application number 102 015 004 824.4 filed Apr. 14, 2015, which is hereby incorporated by reference in its entirety.

FIELD

The disclosure generally relates to a method and an apparatus for controlling current, and more specifically, to a method and an apparatus for controlling current in an array cell.

BACKGROUND

Numerous memory array configurations require the operation of forcing a current and reading out a voltage during sensing, or forcing a high current to change a status of an array cell as rapidly as possible.

These operations, however, often lack in accuracy because the current control is slowed down by parasitic resistances and capacitances present on a selected path.

Memory devices generally comprise a plurality of memory cells arranged in an array and configured to store data. The memory cells are arranged in a regular array of rows and columns. Memory arrays further comprise a plurality of word lines and a plurality of bit lines. Each word line may be coupled to a row of memory cells, whereas each bit line may be coupled to a column of memory cells. If, for example, a cell array comprises n*m columns of memory cells, the memory device may comprise n*m bit lines. Analogously, if the cell array comprises p rows of memory cells, the memory device may comprise p word lines. The cell array comprising n*m columns of memory cells and p rows of memory cells may then comprise p*n*m memory cells altogether. The word lines and the bit lines are employed to access memory cells for reading, erasing, and programming. Generally, a specific memory cell is read, erased, or programmed by application of specific voltages to the word line and to the bit line coupled to the specific memory cell.

A memory device may furthermore comprise a plurality of sense amplifiers. The sense amplifiers are used to sense the logic levels of the bit lines by amplifying small voltage swings to recognizable logic levels. Therefore, the sense amplifiers are instrumental for read-out of the memory cells.

A memory device may comprise a sense amplifier-bit line multiplexer block which couples the sense amplifiers to the bit lines which are coupled to the columns of memory cells in the cell array. The sense amplifier-bit line multiplexer block is employed to reduce the number of sense amplifiers needed to operate a specific number of columns of memory cells. If, as described above, the cell array comprises n*m columns of memory cells, i.e. n*m bit lines, and a sense amplifier-bit line multiplexer block allowing 1:m multiplexing is employed, n sense amplifiers suffice to operate the n*m bit lines. Each of the n sense amplifiers may be coupled to a data line. Therefore, the memory device may comprise n data lines.

An example conventional memory device with the capacity to store 1 Mbit of data may comprise a cell array comprising 1048576 (=1024×1024) memory cells. The 1048576 memory cells may be arranged in a regular array comprising 512 rows, i.e. 512 word lines, and 2048 columns, i.e. 2048 bit lines. If a sense amplifier-bit line multiplexer block allowing 1:64 multiplexing is employed, 32 sense amplifiers suffice to read out each of the 1048576 memory cells (32 bit data words). If the sense amplifier-bit line multiplexer block allows 1:128 multiplexing, 16 sense amplifiers suffice (16 bit data words).

Due to the structure of memory cell arrays, precise current control in an array cell is difficult. When, for example, a write operation is to be carried out, current control is slowed down by parasitic resistances and capacitances present on a selected path, such as bit line and multiplexer capacitances and equivalent resistances, which results in ineffective current control in an array cell.

For these or other reasons there is a need for an improved method and/or apparatus for controlling current in an array cell.

SUMMARY

In accordance with an aspect of the disclosure, there is provided a method for controlling current in an array cell. The method comprises applying a supply voltage to a first access point of a transistor, precharging a second access point of the transistor to a predetermined voltage, applying a control voltage to a third access point of the transistor, and discharging the second access point of the transistor to turn on the transistor which causes a current flow through the array cell connected to the transistor.

In accordance with a further aspect of the disclosure, there is provided an apparatus for controlling current in an array cell. The apparatus comprises a transistor having a first access point, a second access point and a third access point and configured to receive a supply voltage via the first access point and a control voltage via the third access point; a first current control device configured to precharge the second access point of the transistor to a predetermined voltage; a second current control device configured to discharge the second access point of the transistor receiving the control voltage via the third access point, thus turning on the transistor which causes a current flow through the array cell connected to the transistor.

BRIEF DESCRIPTION OF THE DRAWINGS

The accompanying drawings are included to provide a further understanding of the present disclosure and are incorporated in and constitute a part of this specification. The drawings illustrate embodiments of the present disclosure and together with the description serve to explain the principles of the disclosure. Other embodiments of the present disclosure and many of the intended advantages of the present disclosure will be readily appreciated, as they become better understood by reference to the following detailed description.

DETAILED DESCRIPTION

Figure 1:
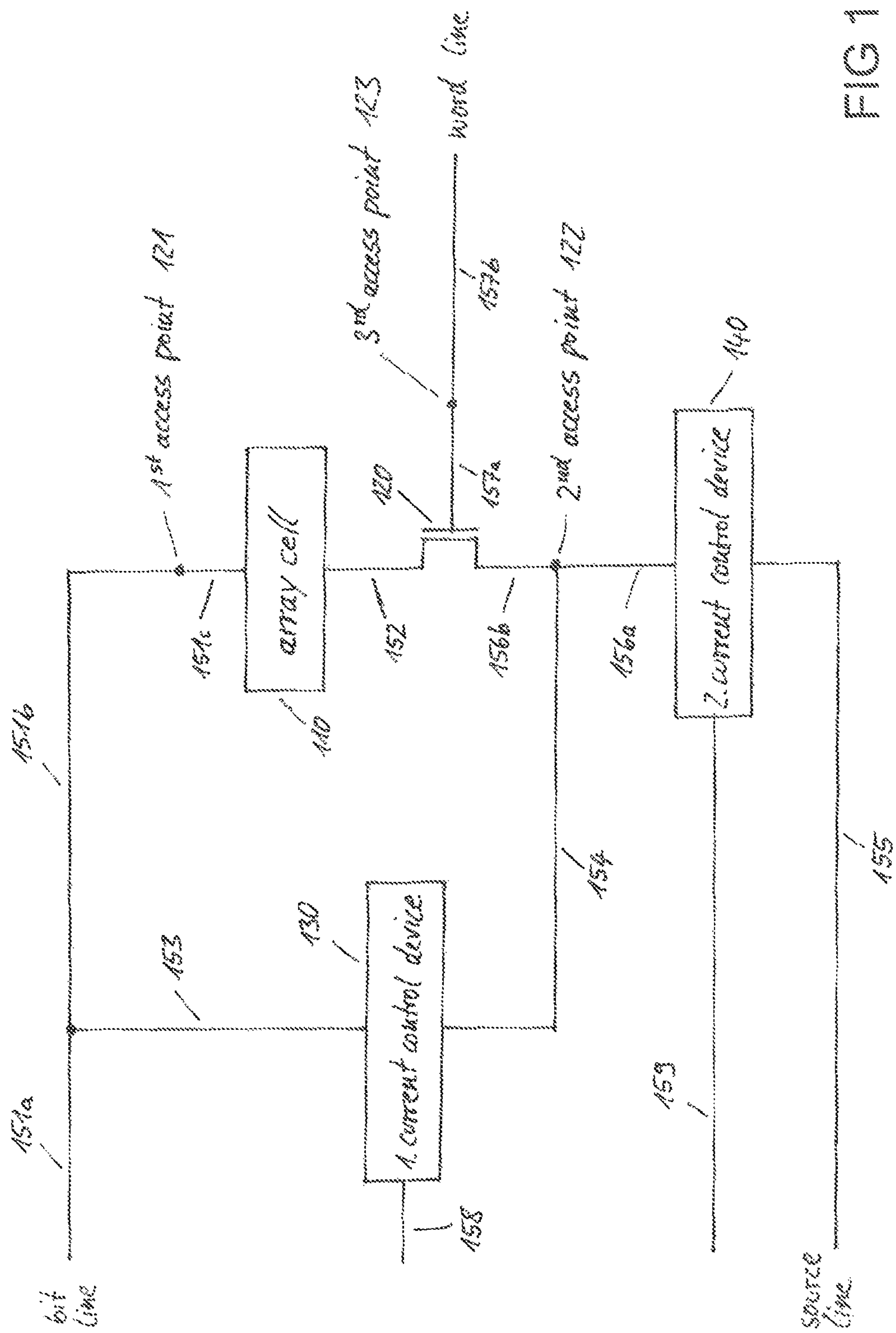
FIG. 1 shows a schematic representation of an array cell and an apparatus for controlling current in the array cell according to an embodiment of the disclosure.

In the following detailed description, reference is made to the accompanying drawings, which form a part hereof, and in which is shown by way of illustration specific embodiments in which the disclosure may be practiced. It is to be understood that other embodiments may be utilized and structural or other changes may be made without departing from the scope of the present disclosure. The following detailed description, therefore, is not to be taken in a limiting sense, and the scope of the present disclosure is defined by the appended claims.

Numerous memory array configurations require the operation of forcing a current and reading out the voltage during sensing or forcing a high current to change a status of an array cell as rapidly as possible.

These operations, however, often lack in accuracy because the current control is slowed down by parasitic resistances and capacitances present on a selected path, such as bit line and multiplexer capacitances and equivalent resistances, which results in ineffective current control in an array cell.

Memory devices generally comprise a plurality of memory cells arranged in an array and configured to store data. The memory cells are arranged in a regular array of rows and columns. Memory arrays further comprise a plurality of word lines and a plurality of bit lines. Each word line may be coupled to a row of memory cells, whereas each bit line may be coupled to a column of memory cells. If, for example, the a cell array comprises n*m columns of memory cells, the memory device will comprise n*m bit lines. Analogously, if the cell array comprises p rows of memory cells, the memory device will comprise p word lines. The cell array comprising n*m columns of memory cells and p rows of memory cells will then comprise p*n*m memory cells altogether. The word lines and the bit lines are employed to access memory cells for reading, erasing, and programming. Generally, a specific memory cell is read, erased, or programmed by application of specific voltages to the word line and to the bit line coupled to the specific memory cell.

A memory device furthermore comprises a plurality of sense amplifiers. The sense amplifiers are used to sense the logic levels of the bit lines by amplifying small voltage swings to recognizable logic levels. Therefore, the sense amplifiers are instrumental for read-out of the memory cells.

A memory device may comprise a sense amplifier-bit line multiplexer block which couples the sense amplifiers to the bit lines which are coupled to the columns of memory cells in the cell array. The sense amplifier-bit line multiplexer block is employed to reduce the number of sense amplifiers needed to operate a specific number of columns of memory cells. If, as described above, the cell array comprises n*m columns of memory cells, i.e. n*m bit lines, and a sense amplifier-bit line multiplexer block allowing 1:m multiplexing is employed, n sense amplifiers suffice to operate the n*m bit lines. Each of the n sense amplifiers may be coupled to a data line. Therefore, the memory device may comprise n data lines.

An example conventional memory device with the capacity to store 1 Mbit of data may comprise a cell array comprising 1048576 (=1024×1024) memory cells. The 1048576 memory cells may be arranged in a regular array comprising 512 rows, i.e. 512 word lines, and 2048 columns, i.e. 2048 bit lines. If a sense amplifier-bit line multiplexer block allowing 1:64 multiplexing is employed, 32 sense amplifiers suffice to read out each of the 1048576 memory cells (32 bit data words). If the sense amplifier-bit line multiplexer block allows 1:128 multiplexing, 16 sense amplifiers suffice (16 bit data words).

Typically, data is read from and written to the cell array in data words. In the described memory device a data word may comprise n bits. Therefore, typically n memory cells are accessed simultaneously. These n memory cells are generally coupled to a common word line. To access such a group of n memory cells of the cell array, a first voltage is applied to one of the p word lines, i.e. to the word line coupled to the n memory cells which are to be accessed, and a second voltage is applied to n of the n*m bit lines, i.e. to the n bit lines coupled to the n memory cells which are to be accessed. The sense amplifier-bit line multiplexer block then couples these n bit lines to the n sense amplifiers. Finally, the n sense amplifiers supply n signals to the n data lines. Thus, in the memory device described above, all p*n*m memory cells of the cell array can be accessed.

To facilitate comprehension of the disclosure, in the following description reference is made to accessing single memory cells of a cell array. In practice, however, memory cells will generally not be accessed individually. Instead, data words will be read from and written to the cell array, i.e. n memory cells will be accessed simultaneously.

Due to the structure of memory cell arrays, precise current control in an array cell is difficult. When, for example, a write operation is to be carried out, current control is slowed down by parasitic resistances and capacitances present on a selected path, such as bit line and multiplexer capacitances and equivalent resistances, which results in ineffective current control in an array cell.

If the voltage of the bit line of a selected array cell is set first, a current limiter is used to limit the current flowing in the bit line and the word line of the selected cell is switched from 0V to its final level, the selected cell will see for a certain time an unlimited current and the wrong voltage because the bit line and its equivalent capacitance has to be charged from its initial value to the final value constrained by the current limitation.

If the voltage of the word line of a selected array cell is set first and then the bit line voltage is linearly increased from 0V to its final level, the selected cell will see a current increasing for a time period which is the settling time for this operation. Thus, during the settling time of the operation, the array cell is operated with a current above 0 A but below the final value of the current used for write operations which results in a soft write operation performed during this time period.

Similar problems arise in memory cell arrays having three connections or access points for each array cell: Two connections for the above described bit line and word line and an additional connection for a source line. In cell arrays having bit lines, source lines and word lines, all three lines of an array cell have to be selected to select the array cell.

For passive array cells such as phase change memory cells and resistive memory cells, for example, a selector transistor is required to select a specific (passive) array cell. The selector transistor which has its gate connected to a word line connects a bit line and a source line of the array cell. A specific array cell is selected by respectively applying voltage on the bit line and source line connected to the specific array cell and selecting the word line of the array cell (i.e. applying a voltage to the gate of the selector transistor of the array cell) to turn on the selector transistor connecting the bit line and the source line of the array cell. The additional connection for the source line helps to avoid leakage within the cell array.

Accordingly, a first access point may be connected to a global bit line of a cell array, a second access point may be connected to a global source line of the cell array, and a third access point may be connected to a word line of the cell array.

Due to the similar structure of memory cell arrays having bit lines, source lines and word lines, similar problems will arise when precise current control is needed when performing, for example, write operations in an array cell of such a memory device. Current control is slowed down or current overshoot is created by parasitic resistances and capacitances present on a selected path, such as bit line, source line and multiplexer capacitances and equivalent resistances, which, again, results in ineffective current control in such an array cell.

FIG. 1 shows a schematic representation of an array cell and an apparatus for controlling current in the array cell according to an embodiment of the disclosure.

The array cell may be a memory cell which is part of a memory cell array of a memory device. The memory device may be any kind of non-volatile memory device, such as, for example, a ROM, flash memory, phase-change memory, resistive memory, magneto-resistive memory, ferroelectric memory, conductive-bridging RAM (CBRAM) etc., and/or volatile memory, such as, for example, RAM, DRAM, SRAM etc.

The apparatus for controlling current in an array cell shown in FIG. 1 comprises a first current control device 130 such as a switch which may be implemented as a transistor, for example, a second current control device 140 which may be implemented as a transistor, for example, and a transistor 120, in particular an n-channel field effect transistor (n-FET), having a first access point 121, a second access point 122 and a third access point 123.

The first access point 121 may be a drain terminal of transistor 120 or may be connected to a drain terminal of transistor 120. The second access point 122 may be a source terminal of transistor 120 or may be connected to a source terminal of transistor 120. The third access point 123 may be a gate terminal of transistor 120 or may be connected to a gate terminal of transistor 120.

The first access point 121 is connected to a supply voltage such as supply voltage of a bit line, in particular a global bit line, via connections 151*a* and 151*b* and is connected to the array cell or array element 110 via connection 151*c*. The second access point 122 is connected to the first current control device 130 via connection 154 and to the second control device 140 via connection 156*a* and is connected to the transistor 120, for example to a source of the transistor 120, via connection 156*b*. The third access point is connected to a control voltage, such as a select voltage of a word line, via connection 157*b* and is connected to the transistor 120, in particular to a gate of the transistor 120, via connection 157*a*.

The first access point may be connected to a global bit line of a cell array comprising the array cell 110, the second access point may be connected to a global source line of the cell array comprising the array cell 110, and the third access point 123 may be connected to a word line of the cell array comprising the array cell 110.

The first current control device 130 is further connected to a supply voltage such as supply voltage of a bit line, in particular a global bit line, via connections 151*a* and 153 and is configured to receive a control signal at its control input via connection 158. The second current control device 140 is further connected to a supply voltage such as supply voltage of a source line, in particular a global source line, via connection 155 and is configured to receive a control signal via connection 159. The array cell 110 is further connected to the transistor 120, for example to a drain of the transistor 120, via connection 152.

The functionality of the apparatus for controlling a current in an array cell depicted in FIG. 1 will now be described in detail.

The first access point 121 which may be connected to a global bit line is charged to a supply voltage of the e.g. bit line, VDD. The second access point 122 which is connected to the e.g. global bit line via the first current control device 130 is charged to a predetermined voltage by suitably controlling the first current control device 130 via its control input. Then, a control voltage is applied to the third access point 123.

These three operations (applying a supply voltage VDD to the first access point 121, applying the predetermined voltage to the second access point 122 and applying the control voltage to the third access point) may be executed substantially simultaneously, given that the three operations are designed such that the n-channel transistor (n-FET) 120 will not turn on during this initial stage.

The predetermined voltage applied to the second access point 122 may be equal to VDD or may be less than VDD, but greater than the control voltage VG applied to the third access point 123 minus the threshold voltage Vth of n-FET 120, i.e. a voltage greater than VG−Vth, so that n-FET 120 will not turn on during this initial stage. It may be advantageous to precharge the second access point 122 to a voltage near VG−Vth in order to reduce the power required for precharging the second access point 122 and to reduce the time required for discharging the second access point 122 to the voltage VG−Vth which turns on the transistor 120. For this, an additional switch (not pictured in FIG. 1) may be included in connection 153 wherein the additional switch may be controlled to disconnect the first control device from the supply voltage of the e.g. bit line and connect the first control device to another supply voltage which provides the desired predetermined voltage.

Then, the first current control device 130 is controlled to turn off disconnecting the second access point 122 from the supply voltage. Substantially at the same time, the second current control device 140 is controlled to discharge the second access point 122, wherein the second access point 122 is advantageously discharged with a constant current, Iref.

When the voltage which is still applied to the second access point 122 reaches VG−Vth (i.e. the control voltage applied to the third access point 123 minus the threshold voltage of n-FET 120), n-FET 120 will turn on and quickly discharge the connection 152 between its e.g. drain and the array cell 110 until the voltage drop in the array cell will be Rcell*Iref which is then independent of the voltage drops on the first and second access points 121 and 122, wherein Rcell is the resistance of the array cell 110 and Iref is the maximum current which is defined by the second current control device 140.

Thus, due to the sudden change of the voltage applied to the array cell, the current in the array cell 110 will increase very quickly: In contrast to the global bit and source lines having rather high parasitic capacitances and resistances due to their bit/source line and multiplexer capacitances and equivalent resistances, the connection 152 between the transistor 120 and the array cell 110 has—compared to the bit and source lines—insignificant parasitic capacitances and resistances as the connection 152 is a very short local connection (i.e. it does not connect different array cells) and does not comprise any additional devices. Hence, fast current changes without current overshoot are feasible and current control is not (or at least not significantly) slowed down due to parasitic capacitances and resistances and current in the array cell 110 can precisely be controlled by the apparatus according to an embodiment of the disclosure which is shown in FIG. 1.

Figure 2:
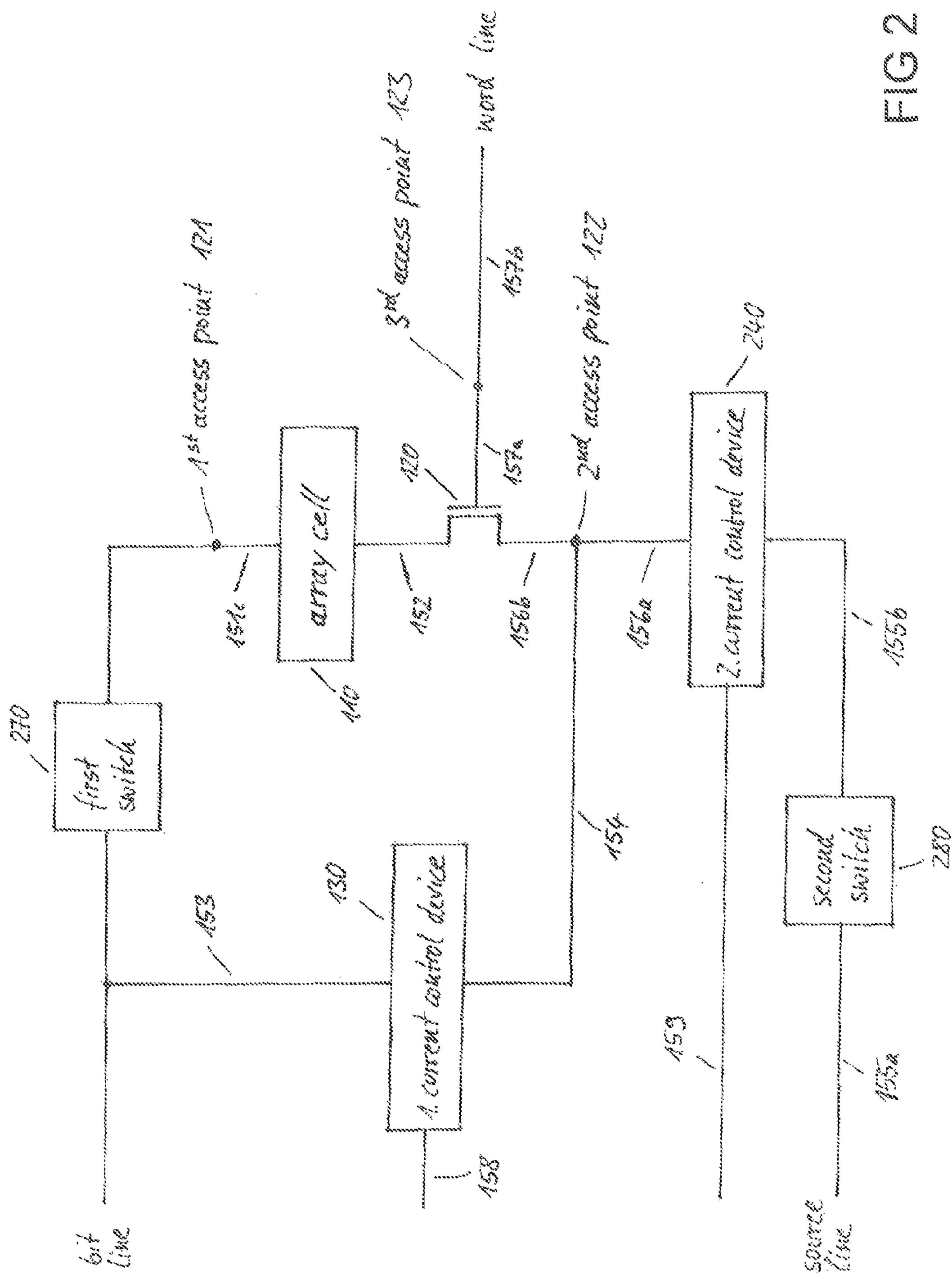
FIG. 2 shows a schematic representation of an array cell and an apparatus for controlling current in the array cell according to a further embodiment of the disclosure.

FIG. 2 shows a schematic representation of an array cell and an apparatus for controlling current in the array cell according to a further embodiment of the disclosure.

The array cell may be a memory cell which is part of a memory cell array of a memory device. The memory device may be any kind of non-volatile memory device, such as, for example, a ROM, flash memory, phase-change memory, resistive memory, magneto-resistive memory, ferroelectric memory, conductive-bridging RAM (CBRAM) etc., and/or volatile memory, such as, for example, RAM, DRAM, SRAM etc.

The apparatus for controlling current in an array cell shown in FIG. 2 is similar to the apparatus shown in FIG. 1, but additionally comprises a first switch 270 and a second switch 280. The first switch 270 may be part of a bit line multiplexer of a cell array comprising the array cell 110 and the second switch 280 may be part of a source line multiplexer of the cell array comprising the array cell 110.

The apparatus for controlling current in an array cell shown in FIG. 2 comprises a first current control device 130 such as a switch which may be implemented as a transistor, for example, a second current control device 240 which may be implemented as a transistor, for example, a first switch 270 which may be implemented as a digital switch, a second switch 280 which may be implemented as a digital switch, and a transistor 120, in particular an n-channel field effect transistor (n-FET), having a first access point 121, a second access point 122 and a third access point 123.

The first access point 121 may be a drain terminal of transistor 120 or may be connected to a drain terminal of transistor 120. The second access point 122 may be a source terminal of transistor 120 or may be connected to a source terminal of transistor 120. The third access point 123 may be a gate terminal of transistor 120 or may be connected to a gate terminal of transistor 120.

The first access point 121 is connected to a supply voltage such as supply voltage of a bit line, in particular a global bit line, via the first switch 270 and connections 151*a* and 151*b* and is connected to the array cell or array element 110 via connection 151*c*. The second access point 122 is connected to the first current control device 130 via connection 154 and to the second control device 240 via connection 156*a* and is connected to the transistor 120, for example to a source of the transistor 120, via connection 156*b*. The third access point is connected to a control voltage such as a select voltage of a word line, via connection 157*b* and is connected to the transistor 120, in particular to a gate of the transistor 120, via connection 157*a*.

The first access point may be connected to a global bit line of a cell array comprising the array cell 110, the second access point may be connected to a global source line of the cell array comprising the array cell 110, and the third access point 123 may be connected to a word line of the cell array comprising the array cell 110.

The first current control device 130 is further connected to a supply voltage such as supply voltage of a bit line, in particular a global bit line, via connections 151*a* and 153 and is configured to receive a control signal at its control input via connection 158. The second current control device 240 is further connected to a supply voltage such as supply voltage of a source line, in particular a global source line, via the second switch 280 and connections 155*a* and 155*b* and is configured to receive a control signal via connection 159. The array cell 110 is further connected to the transistor 120, for example to a drain of the transistor 120, via connection 152.

The functionality of the apparatus for controlling a current in an array cell depicted in FIG. 2 will now be described in detail.

The first switch 270 is turned on to charge the first access point 121 which is connected to a e.g. global bit line to a supply voltage of the e.g. bit line, VDD. The second access point 122 which is connected to the e.g. global bit line via the first current control device 130 is charged to a predetermined voltage by suitably controlling the first current control device 130 via its control input. Then, a control voltage is applied to the third access point 123.

These three operations (applying a supply voltage VDD to the first access point 121, applying the predetermined voltage to the second access point 122 and applying the control voltage to the third access point) may be executed substantially simultaneously, given that the three operations are designed such that the n-channel transistor (n-FET) 120 will not turn on during this initial stage.

The predetermined voltage applied to the second access point 122 may be equal to VDD or may be less than VDD, but greater than the control voltage VG applied to the third access point 123 minus the threshold voltage Vth of n-FET 120, i.e. a voltage greater than VG−Vth, so that n-FET 120 will not turn on during this initial stage. It may be advantageous to precharge the second access point 122 to a voltage near VG−Vth in order to reduce the power required for precharging the second access point 122 and to reduce the time required for discharging the second access point 122 to the voltage VG−Vth which turns on the transistor 120. For this, an additional switch (not pictured in FIG. 2) may be included in connection 153 wherein the additional switch may be controlled to disconnect the first control device from the supply voltage of the e.g. bit line and connect the first control device to another supply voltage which provides the desired predetermined voltage.

Then, the first current control device 130 is controlled to turn off disconnecting the second access point 122 from the supply voltage. Substantially at the same time, the second switch 280 is turned on to discharge the second access point 122 via the second current control device 240, wherein the second current control device 240 is advantageously controlled such that the second access point 122 is discharged with a constant current, Iref.

When the voltage which is still applied to the second access point 122 reaches VG−Vth (i.e. the control voltage applied to the third access point 123 minus the threshold voltage of n-FET 120), n-FET 120 will turn on and quickly discharge the connection 152 between its e.g. drain and the array cell 110 until the voltage drop in the array cell will be Rcell*Iref which is then independent of the voltage drops on the first and second access points 121 and 122, wherein Rcell is the resistance of the array cell 110 and Iref is the maximum current which is defined by the second current control device 240.

Thus, due to the sudden change of the voltage applied to the array cell, the current in the array cell 110 will increase very quickly: In contrast to the global bit and source lines having rather high parasitic capacitances and resistances due to their bit/source line and multiplexer capacitances and equivalent resistances, the connection 152 between the transistor 120 and the array cell 110 has—compared to the bit and source lines—insignificant parasitic capacitances and resistances as the connection 152 is a very short local connection (i.e. it does not connect different array cells) and does not comprise any additional devices. Hence, fast current changes without current overshoot are feasible and current control is not (or at least not significantly) slowed down due to parasitic capacitances and resistances and current in the array cell 110 can precisely be controlled by the apparatus according to an embodiment of the disclosure which is shown in FIG. 2.

Figure 3:
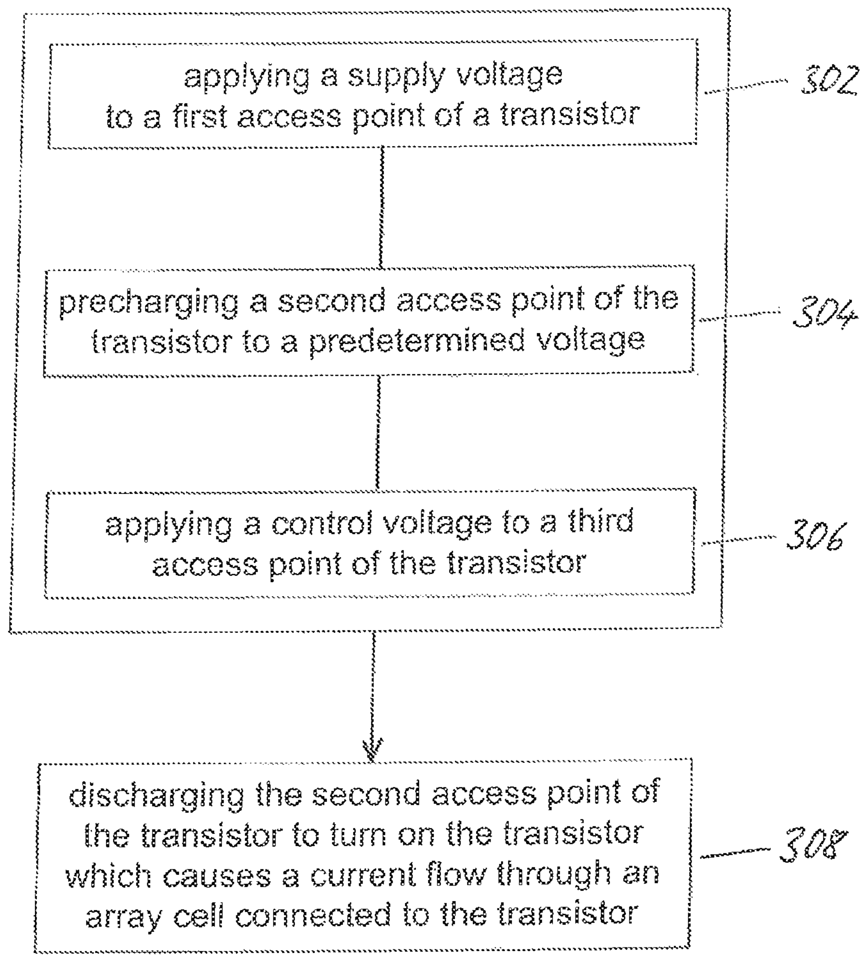
FIG. 3 shows a schematic representation of a method for controlling current in an array cell according to an embodiment of the disclosure.

FIG. 3 shows a schematic representation of an example method according to an embodiment of the disclosure, in particular a method for controlling current in an array cell. The example method comprises applying a supply voltage to a first access point of a transistor (step 302), precharging a second access point of the transistor to a predetermined voltage (step 304), applying a control voltage to a third access point of the transistor (step 306), and discharging the second access point of the transistor to turn on the transistor which causes a current flow through the array cell connected to the transistor (step 308). Transistor 120 may be an n-channel field effect transistor (n-FET).

The predetermined voltage applied to the second access point 122 may be equal to the supply voltage (VDD) or may be less than VDD, but greater than the control voltage (VG) applied to the n-channel transistor 120 minus the threshold voltage (Vth) of transistor 120, i.e. a voltage greater than VG−Vth, so that transistor 120 will not turn on during this initial stage. It may be advantageous to precharge the second access point 122 to a voltage near VG−Vth in order to reduce the power required for precharging the second access point 122 and to reduce the time required for discharging the second access point 122 to the voltage VG−Vth which turns on the transistor 120.

Steps 302, 304 and 306 may be executed substantially simultaneously, given that the three operations are designed such that the n-channel transistor (n-FET) 120 will not turn on during this initial stage. Steps 302, 304 and 306 may also be executed subsequently, however. Then, in step 308, the n-channel transistor 120 is turned on by discharging the second access point of the transistor. The n-channel transistor 120 will then quickly discharge the connection 152 between its e.g. drain and the array cell 110 causing a current to flow through the array cell. The voltage drop in the array cell will reach Rcell*Iref very quickly which is then independent of the voltage drops on the first and second access points 121 and 122, wherein Rcell is the resistance of the array cell 110 and Iref is the maximum current which is defined by the second current control device 140.

Turning on the transistor 120 causes a very fast increase of the current in the array cell 110 as the connection 152 between the transistor 120 and the array cell 110 is a very short local connection (i.e. it does not connect different array cells) and does not comprise any additional devices. Hence, fast current changes without current overshoot are feasible and current control is not (or at least not significantly) slowed down due to parasitic capacitances and resistances and current in the array cell 110 can precisely be controlled using the method according to an embodiment of the disclosure which is shown in FIG. 3.

Figure 4:
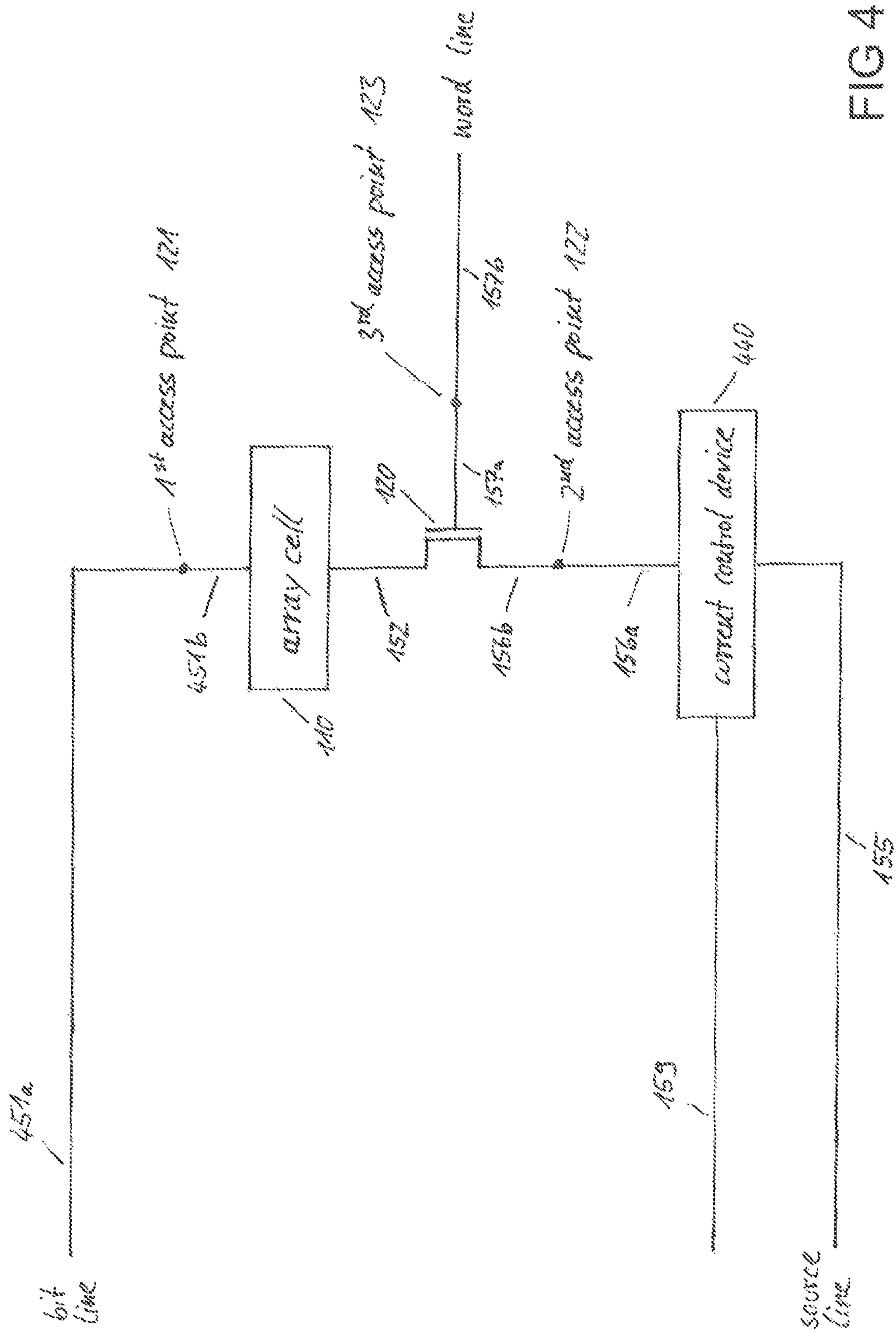
FIG. 4 shows a schematic representation of an array cell and an apparatus for controlling current in the array cell according to a further embodiment of the disclosure.

FIG. 4 shows a schematic representation of an array cell and an apparatus for controlling current in the array cell according to a further embodiment of the disclosure.

The array cell may be a memory cell which is part of a memory cell array of a memory device. The memory device may be any kind of non-volatile memory device, such as, for example, a ROM, flash memory, phase-change memory, resistive memory, magneto-resistive memory, ferroelectric memory, conductive-bridging RAM (CBRAM) etc., and/or volatile memory, such as, for example, RAM, DRAM, SRAM etc.

The apparatus for controlling current in an array cell shown in FIG. 4 comprises a current control device 440 which may be implemented as a transistor, for example, and a transistor 120, in particular an n-channel field effect transistor (n-FET), having a first access point 121, a second access point 122 and a third access point 123.

The first access point 121 may be a drain terminal of transistor 120 or may be connected to a drain terminal of transistor 120. The second access point 122 may be a source terminal of transistor 120 or may be connected to a source terminal of transistor 120. The third access point 123 may be a gate terminal of transistor 120 or may be connected to a gate terminal of transistor 120.

The first access point 121 is connected to a supply voltage such as supply voltage of a bit line, in particular a global bit line, via connection 451*a* and is connected to the array cell or array element 110 via connection 451*b*. The second access point 122 is connected to the current control device 440 via connection 156*a* and is connected to the transistor 120, for example to a source of the transistor 120, via connection 156*b*. The third access point is connected to a control voltage, such as a select voltage of a word line, via connection 157*b* and is connected to the transistor 120, in particular to a gate of the transistor 120, via connection 157*a*.

The first access point may be connected to a global bit line of a cell array comprising the array cell 110, the second access point may be connected to a global source line of the cell array comprising the array cell 110, and the third access point 123 may be connected to a word line of the cell array comprising the array cell 110.

The current control device 440 is further connected to a supply voltage such as supply voltage of a source line, in particular a global source line, via connection 155 and is configured to receive a control signal via connection 159. The array cell 110 is further connected to the transistor 120, for example to a drain of the transistor 120, via connection 152.

The functionality of the apparatus for controlling a current in an array cell depicted in FIG. 4 will now be described in detail.

The first access point 121 which may be connected to a global bit line is charged to a supply voltage of the e.g. bit line, VDD. The second access point 122 which is connected to the e.g. global source line via the current control device 440 is charged to a predetermined voltage by suitably controlling the current control device 440 via its control input. Then, a control voltage is applied to the third access point 123.

These three operations (applying a supply voltage VDD to the first access point 121, applying the predetermined voltage to the second access point 122 and applying the control voltage to the third access point) may be executed substantially simultaneously, given that the three operations are designed such that the n-channel transistor (n-FET) 120 will not turn on during this initial stage.

The predetermined voltage applied to the second access point 122 is a voltage greater than the control voltage VG applied to the third access point 123 minus the threshold voltage Vth of n-FET 120, i.e. a voltage greater than VG−Vth, so that n-FET 120 will not turn on during this initial stage. It may be advantageous to precharge the second access point 122 to a voltage near VG−Vth in order to reduce the power required for precharging the second access point 122 and to reduce the time required for discharging the second access point 122 to the voltage VG−Vth which turns on the transistor 120.

For precharging the second access point 122 to the predetermined voltage, an additional switch (not pictured in FIG. 4) may be included in connection 155 wherein the additional switch may be controlled to disconnect the current control device 440 from the supply voltage of the e.g. source line and connect the current control device 440 to another supply voltage which provides the desired predetermined voltage. In the embodiment shown in FIG. 4, however, the additional switch may be included in the global source line to which connection 155 is connected so that only one additional switch is required for one global source line. Thus, the voltage supplied via connection 155 is variable in the embodiment shown in FIG. 4: In the initial phase, when the second access point 122 is precharged, the predetermined voltage is supplied via connection 155, and then, when the second access point 122 is discharged, the supply voltage of the (global) source line is supplied via connection 155.

Accordingly, having precharged the second access point 122, the current control device 440 is then controlled to discharge the second access point 122 by connecting the second access point 122 to the further voltage source (e.g. the supply voltage of the global source line), wherein the second access point 122 is advantageously discharged with a constant current, Iref.

When the voltage which is still applied to the second access point 122 reaches VG−Vth (i.e. the control voltage applied to the third access point 123 minus the threshold voltage of n-FET 120), n-FET 120 will turn on and quickly discharge the connection 152 between its e.g. drain and the array cell 110 until the voltage drop in the array cell will be Rcell*Iref which is then independent of the voltage drops on the first and second access points 121 and 122, wherein Rcell is the resistance of the array cell 110 and Iref is the maximum current which is defined by the current control device 440.

Thus, due to the sudden change of the voltage applied to the array cell, the current in the array cell 110 will increase very quickly: In contrast to the global bit and source lines having rather high parasitic capacitances and resistances due to their bit/source line and multiplexer capacitances and equivalent resistances, the connection 152 between the transistor 120 and the array cell 110 has—compared to the bit and source lines—insignificant parasitic capacitances and resistances as the connection 152 is a very short local connection (i.e. it does not connect different array cells) and does not comprise any additional devices. Hence, fast current changes without current overshoot are feasible and current control is not (or at least not significantly) slowed down due to parasitic capacitances and resistances and current in the array cell 110 can precisely be controlled by the apparatus according to an embodiment of the disclosure which is shown in FIG. 4.

Although specific embodiments have been illustrated and described herein, it will be appreciated by those of ordinary skill in the art that a variety of alternate and/or equivalent implementations may be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A method for controlling current in an array cell, comprising:

applying a supply voltage to a first access point of a transistor that is operatively coupled to the array cell;

precharging a second access point of the transistor to a predetermined voltage;

applying a control voltage to a third access point of the transistor; and discharging the second access point of the transistor to turn on the transistor which causes a current flow through the array cell connected to the transistor.

2. The method of claim 1, wherein a current control device precharges the second access point of the transistor by connecting the second access point of the transistor to a predetermined voltage and discharges the second access point of the transistor by connecting the second access point of the transistor to a further supply voltage.

3. The method of claim 1, wherein precharging the second access point of the transistor is carried out by using a first current control device which connects the second access point of the transistor to the supply voltage, controls a current such that the second access point of the transistor is charged to a predetermined voltage, and disconnects the second access point of the transistor from the supply voltage before the second access point of the transistor is discharged by means of a second current control device.

4. The method of claim 1, wherein the second access point of the transistor is discharged with a constant current.

5. The method of claim 1, wherein the supply voltage is a supply voltage of a bit line connected to the array cell.

6. The method of claim 1, wherein the control voltage is a select voltage of a word line connected to the array cell.

7. The method of claim 1, wherein the acts of connecting a first access point of a transistor to a supply voltage, precharging the second access point of the transistor, and applying the control voltage to the third access point of the transistor are carried out substantially simultaneously.

8. An apparatus for controlling current in an array cell, the apparatus comprising:

a transistor that is operatively coupled to the array cell having a first access point, a second access point and a third access point and configured to receive a supply voltage via the first access point and a control voltage via the third access point;

a first current control device configured to precharge the second access point of the transistor to a predetermined voltage; and a second current control device configured to discharge the second access point of the transistor upon receiving the control voltage via the third access point, thus turning on the transistor which causes a current flow through the array cell connected to the transistor.

9. The apparatus of claim 8, wherein the first current control device is configured to precharge the second access point of the transistor to a predetermined voltage by connecting the second access point of the transistor to the supply voltage, controlling a current such that the second access point of the transistor is charged to a predetermined voltage and disconnecting the second access point of the transistor from the supply voltage before the second access point of the transistor is discharged by the second current control device.

10. The apparatus of claim 8, wherein the second current control device is configured to discharge the second access point of the transistor with a constant current.

11. The apparatus of claim 8, wherein the transistor is an n-channel field effect transistor.

12. The apparatus of claim 11, wherein the predetermined voltage is equal to or smaller than the supply voltage and greater than a voltage obtained by subtracting a threshold voltage of the n-channel field effect transistor from the control voltage applied to the third access point of the transistor.

13. The apparatus of claim 8, wherein the supply voltage is a supply voltage of a bit line connected to the array cell.

14. The apparatus of claim 8, wherein the control voltage is a select voltage of a word line connected to the array cell.

15. The apparatus of claim 8, wherein the array cell is a memory array cell.

16. An apparatus for controlling current in an array cell, the apparatus comprising:

means for applying a supply voltage to a first access point of a transistor that is operatively coupled to the array cell;

means for precharging a second access point of the transistor;

means for applying a control voltage to a third access point of the transistor; and means for discharging the second access point of the transistor to turn on the transistor which causes a current flow through the array cell connected to the transistor.

17. The apparatus of claim 16, wherein the means for precharging and the means for discharging are comprised in a current control device which is configured to precharge the second access point of the transistor by connecting the second access point of the transistor to a predetermined voltage and to discharge the second access point of the transistor by connecting the second access point of the transistor to a further supply voltage.

18. The apparatus of claim 16, wherein the means for precharging the second access point of the transistor are configured to connect the second access point of the transistor to the supply voltage, control a current such that the second access point of the transistor is charged to a predetermined voltage, and disconnect the second access point of the transistor from the supply voltage before the second access point of the transistor is discharged by the means for discharging the second access point of the transistor.

* * * * *